US006245149B1

United States Patent
de Lomenie et al.

(10) Patent No.: US 6,245,149 B1
(45) Date of Patent: Jun. 12, 2001

(54) INERT BARRIER FOR HIGH PURITY EPITAXIAL DEPOSITION SYSTEMS

(75) Inventors: Romain Beau de Lomenie, Menlo Park; David K. Carlson, Santa Clara, both of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/346,646

(22) Filed: Jul. 1, 1999

(51) Int. Cl.[7] ................................................. C23C 16/00
(52) U.S. Cl. .................... 118/719; 118/715; 118/725; 118/733
(58) Field of Search .................... 118/715, 725, 118/719, 733

(56) References Cited

U.S. PATENT DOCUMENTS

| 3,953,566 | 4/1976 | Gore ....................................... 264/288 |
| 5,492,336 | 2/1996 | Barna et al. .............................. 277/1 |
| 5,494,301 | 2/1996 | Hamilton et al. ...................... 277/227 |
| 5,722,668 | * 3/1998 | Rice et al. ............................. 277/180 |

OTHER PUBLICATIONS

Gore BG Form–In–Place Gasketing Installation Instructions brouchure, W.L. Gore & Associates Inc. Sealant Technology Group, 1997.

Gore BG Form–In–Place Gasketing Product Information brouchure, W.L. Gore & Associates Inc. Sealant Technology Group, 1998.

* cited by examiner

Primary Examiner—Richard Bueker
(74) Attorney, Agent, or Firm—Blakely Sokoloff Taylor & Zafman

(57) ABSTRACT

The present invention is an improved semiconductor substrate processing apparatus which includes a processing chamber having a first member, a second member and a processing region; a vacuum tight seal between said first and said second members that enables a pressure controlled environment within said processing region; and a barrier between said first and second members which separates said seal from said processing region, said barrier being substantially non-reactive with processes conducted in said processing region.

17 Claims, 9 Drawing Sheets

INERT BARRIER FOR HIGH PURITY EPITAXIAL DEPOSITION SYSTEMS

BACKGROUND OF THE INVENTION

1. Field of the Invention

This invention relates to semiconductor processing apparatus and, more particularly, to the use of an inert barrier to insulate an O-ring seal and prevent O-ring contamination of the processing region.

2. Description of the Related Art

Present day equipment for the semiconductor industry seeks to obtain increased throughput by transitioning from 200 mm substrates toward larger substrate diameters such as 300 mm. Larger substrate diameters necessitate increased gas flows and energy input requirements to enable the same processing results achieved on smaller diameter substrates. At the same time, increased throughput is sought through the extension of deposition cycles. However, increases in deposition cycles are directly proportional to increased cleaning cycles particularly in those processing areas that utilize periodic cleaning cycles. One example of a process that utilizes periodic cleaning is the deposition of epitaxial silicon. In an epitaxial silicon reactor, a typical cleaning cycle is particularly arduous since it includes heating the processing region to about 1200° C. and injecting HCl. The combination of increased energy requirements that are needed for larger substrates and the desire for longer cleaning cycles has strained the design of existing reactors. Exposed components are particularly vulnerable to the increased requirements such as the innermost O-rings or those O-rings closest to the process area. In typical reactors these O-rings provide a pressure seal for the processing chamber and are exposed to the heat and chemistry of both the deposition and the cleaning cycles.

FIG. 1 is a typical example of a double dome processing reactor suitable for chemical vapor deposition (CVD) of silicon films such as the EPI chamber sold by Applied Materials, Inc. of Santa Clara, Calif. In this figure a CVD reactor 10 includes a top dome 12, a bottom dome 16 and side walls 14, 15 which together define a processing region 18 into which single or multiple substrates, such as silicon wafer 20, can be loaded. Wafer 20 is mounted on a susceptor 22 that can be rotated by drive 23 to provide a time-averaged environment for the wafer 20 that is cylindrically symmetric. A quartz ring 118 is disposed between sidewalls 14 and 15 and susceptor 22. A preheat ring 24 is supported by quartz ring 118 and surrounds susceptor 22.

Wafer 20, preheat ring 24 and susceptor 22 are heated by a plurality of lamps 26 mounted outside processing region 18. Top dome 12, bottom dome 16 and insert 118 are typically made from quartz because it is transparent to light of both visible and IR frequency, it exhibits relatively high strength and because it is chemically stable in the processing environment of the chamber. Sidewalls 14 and 15 include clamp rings 40 and 42 that are used to secure top and bottom domes 12 and 16 to base ring 44. Clamp rings 40 and 42 and base ring 44 are typically made from stainless steel.

The structure of side walls 14 and 15 and their relationship to processing region 18 can be better appreciated by referring to FIG. 2. FIG. 2 illustrates an enlarged view of sidewalls 14, 15 and insert 118. O-rings 50, 52, 54 and 56 are used to form seals between upper clamp ring 40 and base ring 44 enabling a pressure seal between top dome 12 and processing region 18. Additionally, O-rings 50, 52, 54, and 56 are arranged to structurally support top dome 12 and counteract loading and thermal stresses. The near direct vertical alignment between O-rings 50 and 54 and between O-rings 52 and 56 indicates the top dome 12 is in compression with only a slightly cantilevered load. Top dome 12 is not in contact with either upper clamp ring 40 or base ring 44. As such, gaps exist between top dome 12 and upper clamp ring 40 and base ring 44.

Lower dome 16 is similarly supported. O-rings 58 and 60 are used to form seals between lower clamp ring 42 and base ring 44 and bottom dome 16. Like top dome 12, bottom dome 16 is not in contact with the sidewall elements that support it. Gaps exist between bottom dome 16 and rings 42 and 44. Gaps are also present between quartz insert 118 and top and bottom domes 12 and 16.

Referring back to FIG. 1, processing gas (whether reactant or dopant or cleaning) is supplied to processing region 18 from an exterior source, schematically represented by two tanks 28. The gas flows from the gas supply 28 along a gas supply line 30 and into processing region 18 via a gas inlet port 32. From the port 32 the gas flows through a passage in sidewalls 14 and 15 and a passage in quartz insert 118. From insert 118, the gas flows across the preheat ring 24 across the susceptor 22 and wafer 20 in the direction of the arrows 34 to be evacuated from region 18 through evacuation port 36. A pumping source or other exhaust piping system is coupled to evacuation port 36 for the purpose of exhausting gases and by-products from processing region 18. The dominant shape of the flow profile of the gases is laminar from the gas input port 32 and across the preheat ring 24 and the wafer 20 to the exhaust port 36 even though the rotation of the wafer 20 and thermal gradients caused by the heat from the lamps 26 do affect the flow profile slightly.

The above described CVD processing chamber can accommodate a number of different processes. Each process differs depending on the desired end result and has different considerations associated therewith. In the polysilicon deposition process, doped or undoped silicon layers are typically deposited onto the wafer using processes such as low pressure chemical vapor deposition (CVD). In this process a reactant gas mixture including a source of silicon (such as silane, disilane, dichlorosilane, trichlorosilane or silicon tetrachloride) and optionally a dopant gas (such as phosphine, arsine, or diborane) is heated and passed over the wafer to deposit a silicon film on its surface. In some instances a non-reactant, carrier gas such as hydrogen, is also injected into the processing chamber together with either or both of the reactant or dopant gases. In this process, the crystallographic nature of the deposited silicon depends upon the temperature of deposition. At low reaction temperatures of about 600° C. the deposited silicon is mostly amorphous; when higher deposition temperatures of about 650° C. to 800° C. are employed, a mixture of amorphous silicon and polysilicon or polysilicon alone will be deposited.

Processing region 18 could be cleaned after each deposition sequence or after a series of deposition sequences has been conducted. In a typical HCl based periodic cleaning cycle, a chamber clean cycle is conducted for every 10 to 20 $\mu$m of silicon deposited in reactor 10. The cleaning cycle is conducted after removing the last wafer of the sequence from chamber 10. Without a wafer present in the chamber, the susceptor temperature is raised to about 1200° C. while a mixture of HCl and $H_2$ is provided to processing region 18. The HCl breaks down the silicon deposits formed within processing region 18 into volatile by-products that are exhausted from processing region 18 via evacuation port 36.

One problem with current CVD reactors is that O-rings 50, 52, 54, 56, 58 and 60 are degraded by prolonged exposure to the chemistry, temperatures and pressures employed within processing region 18 during the deposition and cleaning processes. Typical removal rates form the HCl cleaning process above are about 2 μm/min. Longer deposition sequences, such as those having about 20 μm depositions between cleans, provide higher throughput but increase the length of exposure to HCl and 1200° C. which in turn increases the likelihood of O-ring degradation and failure. Degraded or failed O-rings result in contamination of processing region 18 and films formed therein as well as loss of process environment control such as loss of pressure control.

One measure of the lack of contamination or level of purity within processing region 18 is the resistivity measurement of an undoped epitaxial silicon film deposited in region 18. Since silicon has an intrinsically high resistivity on the order of greater than 800 Ω-cm, resistivity measurements below 800 Ω-cm indicate contamination of some kind within the processing region. A high degree of purity within region 18 is desired initially so that dopants can be incorporated with greater certainty to provide doped silicon films with specific resistivity. O-rings, such as those utilized as in FIGS. 1 and 2, are typically limited to about 20 μm deposition cycles or cleaning cycles of HCl at 1200° C. lasting less than about 30 minutes. Because of their direct exposure to region 18, degradation or failure of these O-rings (56 and 58) leads to processing area contamination which in turn results in resistivities on the order of 20–30 Ω-cm.

What is needed is a processing apparatus which can overcome the shortcomings of the prior art by extending the processing throughput capability of an O-ring sealed reactor beyond 20 μm deposition between cleans. Such a reactor would be capable of extended high temperature epitaxial deposition cycles capable of depositing films about 20 μm or more thick. Such a reactor would extend the duration of HCl cleans while also preventing O-ring based contamination from reaching the processing region.

BRIEF SUMMARY OF THE INVENTION

An aspect of the present invention is an improved semiconductor substrate processing apparatus having a processing chamber having a first member, a second member and a processing region; a vacuum tight seal between said first and said second members that enables a pressure controlled environment within said processing region; and a barrier disposed between said first and second members which separates said seal from said processing region, said barrier being substantially non-reactive with processes conducted in said processing region.

Another aspect of the present invention is an improved apparatus for depositing silicon which includes a processing chamber having a first element, a second element and a processing region; an O-ring between said first and second elements that enables pressure controlled processes within said processing region; and a linearly shaped material comprising expanded polytetrafluoroethylene said material being substantially inert to the temperature, pressure and chemical environment within said processing region, said material having a first notched end, a second notched end adaptively coupled to said first notched end, a thickness and a length wherein said linear material circumscribes said processing region when said first notched end is coupled to said second notched end thereby said inert material separates said processing region from said O-ring.

Another aspect of the present invention is an improved apparatus for depositing silicon which includes a processing chamber having a top dome, a bottom dome, a base ring and a clamp ring coupled to and separating said top dome and said bottom dome wherein said top dome, bottom dome, base ring and clamp ring define a processing region, a susceptor disposed within said processing region, a plurality of lamps which illuminate said susceptor, and a quartz liner disposed adjacent to said susceptor; a seal disposed between said base ring and each of said domes and a seal between said clamp ring and each of said domes wherein said domes, said base ring and said clamp rings are compressably in contact with said seals to enable a pressure controlled environment within said processing region; and barriers disposed between each of said seals and said processing region wherein said barrier is prevents contaminants from said seals from reaching said processing region, wherein said seals and said barriers are disposed within grooves formed in said clamp ring and said base ring.

DETAILED DESCRIPTION OF THE INVENTION

The present invention is directed to the use of an inert barrier material to prolong the life of primary chamber O-rings and prevent O-ring contaminants from reaching the processing region of a semiconductor processing reactor.

Figure 1:
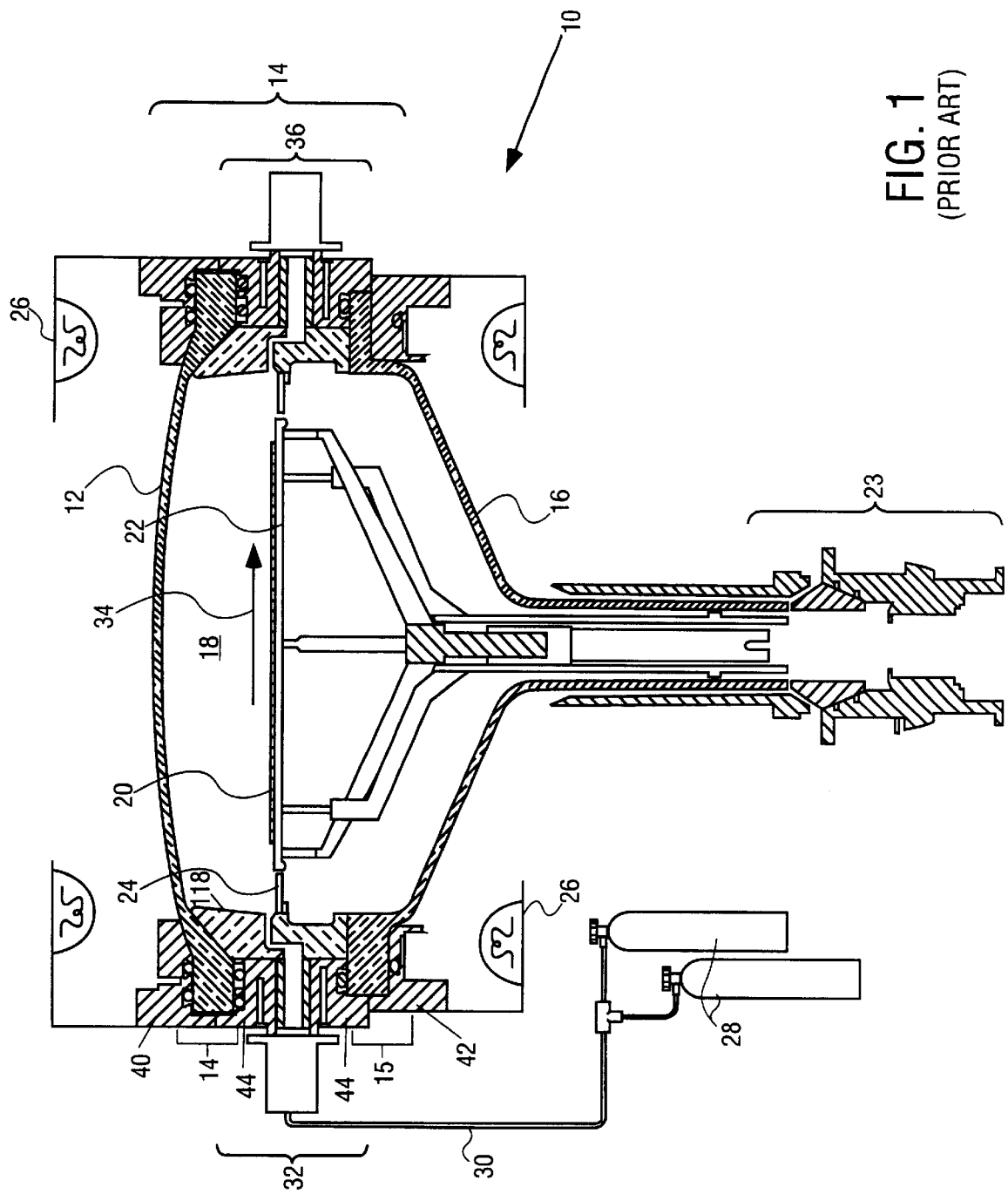
FIG. 1 is a cross section view of a prior art CVD processing reactor.
Figure 2:
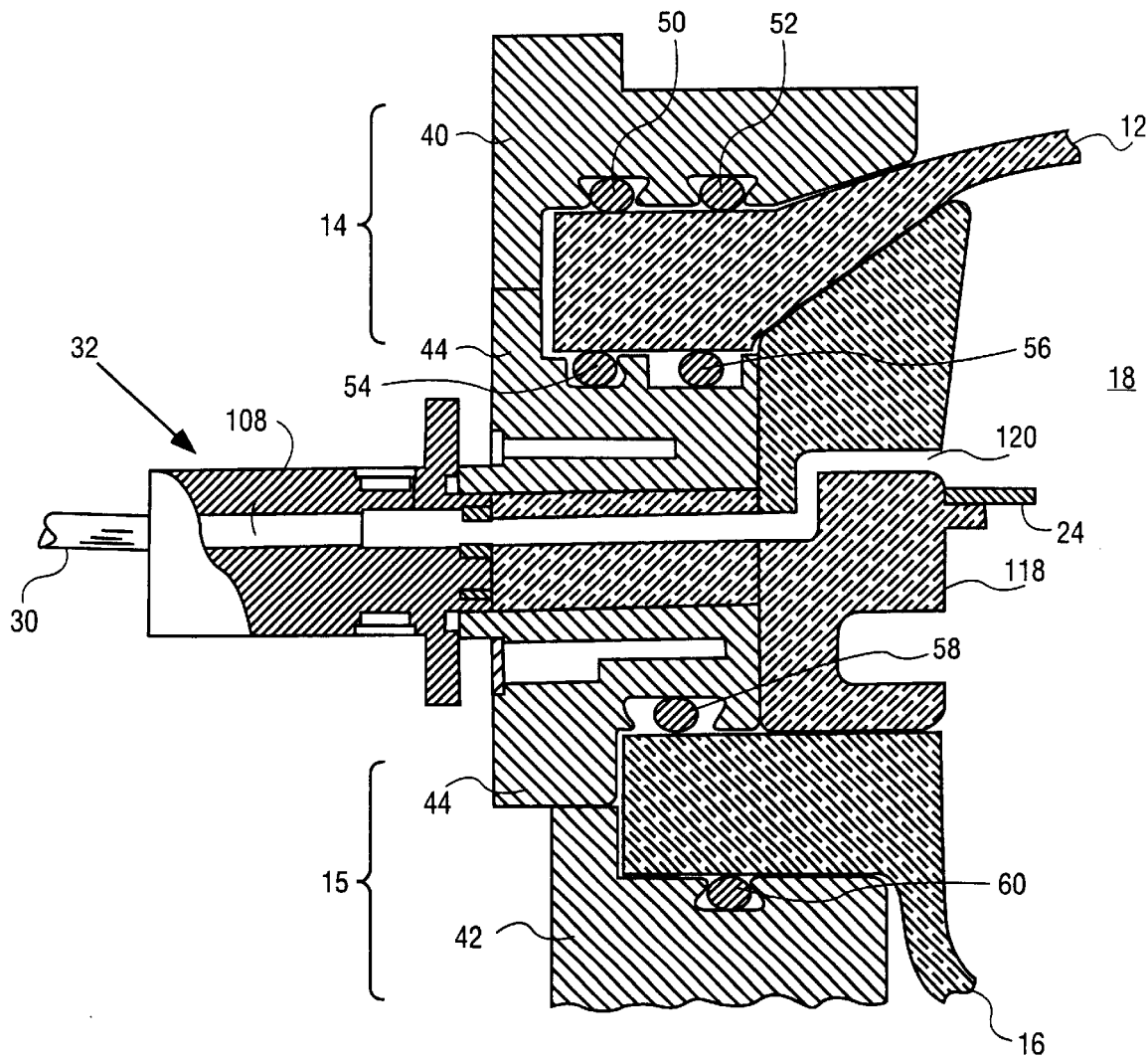
FIG. 2 is a cross section view of a sidewall of a prior art CVD reactor.
Figure 3:
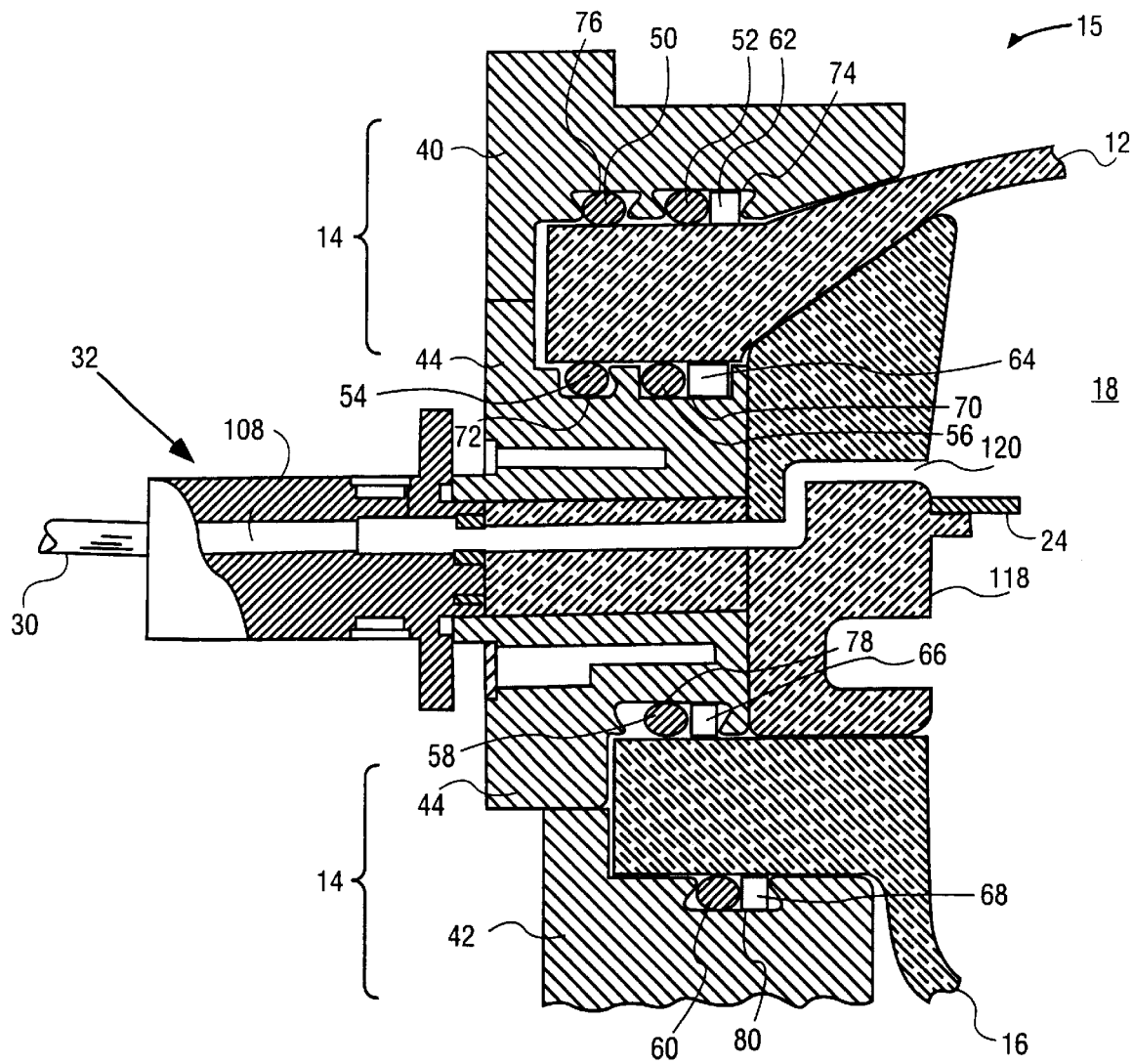
FIG. 3 is a cross section view of a sidewall of a CVD processing reactor according to the present invention.

Specific details of the present invention can be better appreciated by turning now to FIG. 3 which is a cross section view of a sidewall of a processing reactor 15 having inert barriers 62, 64, 66 and 68 according to the present invention. Process reactor 15 is a double dome CVD reactor similar to prior art processing reactor 10 and as such common components will be referred to by the same reference numbers.

Top dome 12 is held in place by the compressive force exerted by upper clamp ring 40 and base ring 44 on O-rings 50, 52, 54 and 56. O-rings are disposed within grooves formed within the surfaces of upper clamp ring 40, lower clamp ring 42 and base ring 44. O-rings are fabricated from material most compatible with semiconductor processes and a variety of loading situations. Representative O-rings materials are silicone, and polyfluoronated compounds such as Teflon, Viton, Kalrez and varieties of Teflon encapsulated O-ring compounds. Top dome 12 is not in contact with upper clamp ring 40 or base ring 44.

Top dome 12 is in contact with but does not form a seal with quartz ring 118. An inert barrier 62 is disposed adjacent to O-ring 52 and an inert barrier 64 is disposed adjacent to O-ring 56. Inert barriers 62 and 64, when installed, circumscribe process region 18. Since there is no seal between quartz insert 118 and top dome 12, inert barrier 64 is exposed to the process gases and chemistry of process region 18. However, because barrier 64 is erected between top dome 12 and base ring 44, O-ring 56 is not exposed to the process chemistry present in region 18. Additionally, any contaminates released by O-ring 56 cannot pass barrier 64 and thus are prevented from contaminating processing region 18. Particularly with regard to O-ring 56, barrier material 64 is disposed adjacent to O-ring 56, circumscribes processing region 18 and is between process region 18 and O-ring 56.

Bottom dome 16 is held in place by the compressive force exerted by lower clamp ring 42 and base ring 44 on O-rings 58 and 60. Lower dome 16 is not in contact with lower clamp ring 42 or base ring 44. Quartz ring 118 is in contact with but does not form a sealing surface with lower dome 16. An inert barrier 66 is disposed adjacent to O-ring 58 and an inert barrier 68 is disposed adjacent to O-ring 60. Inert barriers 66 and 68, when installed, circumscribe process region 18. Since there is no seal between quartz insert 118 and bottom dome 16, inert barrier 66 is exposed to the process gases and chemistry of process region 18. However, because barrier 66 is erected between bottom dome 16 and base ring 44, O-ring 58 is not exposed to the process chemistry present in region 18. Additionally, any contaminates released by O-ring 58 do not pass barrier 66 and thus are prevented from contaminating processing region 18. Particularly with regard to O-ring 58, barrier material 66 is disposed adjacent to O-ring 58, circumscribes processing region 18 and is between process region 18 and O-ring 58.

O-rings 56 and 58 form the primary vacuum tight seals between the chamber members adjacent to each O-ring. O-ring 56 forms a seal between upper dome 12 and base ring 44 while O-ring 58 forms a seal between lower dome 16 and base ring 44. The seals formed by O-rings 56 and 58 enable vacuum, atmospheric pressure and high pressure operations to be conducted within processing region 18. In the deposition of epitaxial silicon, process pressures can range anywhere from about 10 Torr to 1000 Torr. Typical pressures are 760 Torr for atmospheric pressure processes and between about 20 Torr to 100 Torr for reduced pressure processes.

O-rings 50, 52, 54 and 60 are used to evenly distribute the compressive and loading forces of clamp rings and base rings across upper and lower domes 12 and 16. O-rings 50, 52, 54 and 60 also act as secondary pressure seals for processing region 18. Thus, all sealing and loading forces are borne by O-rings 50, 52, 54, 56, 58 and 60. Also illustrated in the representative double dome reactor embodiment of the present invention are the separate grooves formed within upper and lower clamp rings 40 and 42 and base ring 44 to accommodate the O-rings and barrier material of the present invention. Base ring 44 provides separated support O-rings and sealing O-rings such as groove 70 that accommodates primary seal O-ring 56 and barrier 64 while groove 72 accommodates support and secondary seal O-ring 54. Base ring 44 also provides a combined sealing and support O-ring as found in groove 78 that accommodates support and secondary seal O-ring 58 and barrier 66. Upper clamp ring 40 is illustrative of a separate support and sealing O-ring design that includes a groove 76 that accommodates support and sealing O-ring 50 and groove 74 that accommodates a primary sealing O-ring 52 and a barrier 62. Lower clamp ring 42 is illustrative of a combined sealing and support O-ring that includes a single groove 80 that accommodates sealing and support O-ring 60 and a barrier 68. The O-ring and barrier locations and groove configurations illustrated in the embodiment of FIG. 3 are merely representative of an O-ring and barrier locations and groove design configuration. One of ordinary skill will appreciate that a wide variety of O-ring and barrier locations and groove size designs may be employed without departing from the spirit of the present invention. Those alternative designs and configurations will vary according to the size and type of reactor into which the barrier of the present invention is to be employed.

Although under compressive force, inert barriers 62, 64, 66 and 68 are not considered part of the loading, distribution or support for upper and lower domes 12 and 16. Additionally, inert barriers 62, 64, 66 and 68 are not relied on to provide a pressure seal for processing region 18. In fact, tests conducted in a processing reactor similar to reactor 15 that used barriers 62, 64, 66 and 68 alone (i.e., without any O-rings) was unable to provide a sufficient seal for which adequate pressure control could be maintained within processing region 18. Since inert barrier material 62, 64, 66 and 68 alone is inadequate for sealing semiconductor processing reactors, the pressure seal for processing region 18 is provided by the sealing and support O-rings disposed between upper and lower domes 12 and 16 under compressive force of clamp rings 40 and 42 and base ring 44.

Inert barriers 62, 64, 66 and 68 provide insulation to O-rings from convection heat generated within processing region 18. One reason for positioning a barrier between processing region 18 and an O-ring is that hot gases from processing region 18 would contact only the barrier and not the adjacent O-ring. O-rings still receive considerable thermal energy from the radiation from lamps 28 transmitted through domes 12 and 16 as well as conductive heating from the stainless steel components of side wall 14. Additionally, because gaps exist between quartz domes 12 and 16 and insert 118, inert barriers 64 and 66 are in contact with deposition and cleaning gases used within processing region 18. Because inert barriers 64 and 66 have formed effective barriers between base ring 44 and top and bottom domes 12 and 16, O-rings 58, 54 and 56 are not exposed to the high temperature epitaxial silicon deposition chemistry used during deposition processes and, more importantly, not exposed to the high temperature HCl based chemistry used during cleaning processes.

The material used for inert barrier 62, 64, 66 and 68 should be substantially non-reactive or inert to the chemistry, temperature, and pressures utilized within processing region 18. Such a material would be capable of sustained exposure to susceptor temperatures ranging between 950° C. to 1250° C. and reactive source gases typically employed during epitaxial silicon deposition. Additionally, such a material would be capable of prolonged exposure to 1200° C. susceptor temperature, and HCl based cleaning chemistry. Such a material would withstand prolonged exposure to both the epitaxial silicon deposition and cleaning cycles without degradation or contaminate generation. Typically in a chamber 15 of FIG. 3, a susceptor temperature of 1200° C. results in temperatures of between about 280° C. to 480° C. in the vicinity of barrier materials 62, 64, 66 and 68. Additionally, the barrier material should be so positioned relative to any pathway between an O-ring and processing region 18 such that O-ring contaminates would not reach processing region 18. For example, barrier 64 is positioned so as to block the path from O-rings 54 and 56 to the gap between top dome 12 and quartz insert 118 and on into processing region 18.

A material with superior heat and chemical resistant properties suitable for use as a barrier material is polytetrafluoroetheylene (PTFE). The PTFE may be produced in an expanded porous form as taught in U.S. Pat. No. 3,953,566 issued Apr. 27, 1976 to Gore. Suitable barrier materials may also be produced with limited long term creep by wrapping a core of elongated or expanded PTFE with a high strength film of expanded PTFE as discussed in U.S. Pat. No. 5,494,301 and U.S. Pat. No. 5,492,336 both of which are assigned to W.L. Gore Associates. One material suitable as a barrier material is an expanded polytetrafluoroethylene with high multidirectional tensile strength such as that available from W.L. Gore Associates under the product name Gore BG.

Figure 4:
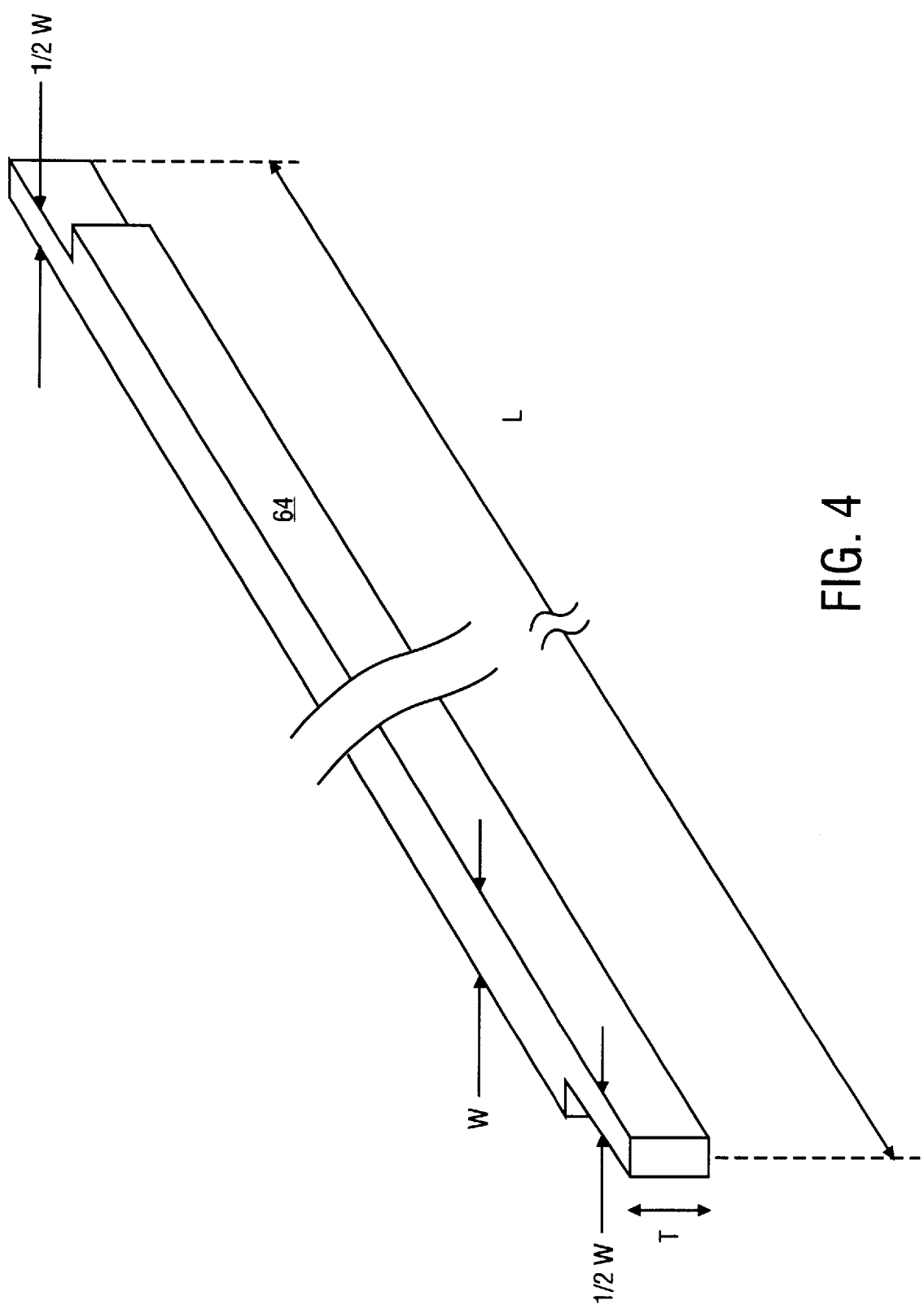
FIG. 4 is perspective view of an inert barrier according to the present invention.

FIG. 4 illustrates an expanded PTFE barrier material according to an embodiment of the present invention. Although the illustrative embodiments which follow are described with regard to barrier 64, barriers 62, 66, and 68 are similarly shaped and employed within processing reactor 15 according to the present invention. As shown in FIG. 4, a barrier 64 has been cut into a linearly shaped continuous piece having an overall length (l), a width (w) and thickness (t) and adaptively coupled ends A and B. A PTFE barrier exhibits shrinkage when employed in a processing reactor according to the present invention. The dimensions l, w, and t of the barrier are therefore advantageously selected to compensate for dimensional changes in the barrier as a result of processing chamber operations. For example, shrinkage along length l is accommodated by slideably and adaptively coupled ends A and B.

Adaptively coupled ends A and B are notched on opposite sides to a notched width of about one-half the overall width of barrier 64 or ½ w. The width w is sufficiently wide such that ½ w is an effective barrier. The width ½ w is used in conjunction with adaptively coupled ends A and B as described with respect to FIG. 8. The thickness t is selected so that sufficient contact remains between the barrier and the adjacent elements to form an effective barrier. The barrier material dimensions l, w, and t are selected so that the material provides an effective O-ring barrier under the operating conditions of the processing reactor into which the barrier is installed.

The length of barrier 64 in FIG. 4 represents the original pre-shrunk length of barrier 64 at a first temperature or at ambient temperature of about 85° F. or 29.4° C. or those ambient conditions within a wafer processing facility while reactor 15 is not in operation. In a preferred embodiment where reactor 15 is a double dome CVD reactor capable of processing 300 mm substrates, barrier 64 would have an original length of about 64 inches with a rectangular cross section or a cross section where the thickness (t) and width (w) are each 0.285 inches. Although the embodiments described below are described with respect to the position of barrier 64 relative to O-ring 56, the descriptions which follow are also applicable to barriers 62, 66 and 68 and O-rings 52, 58, and 60.

Figure 5:
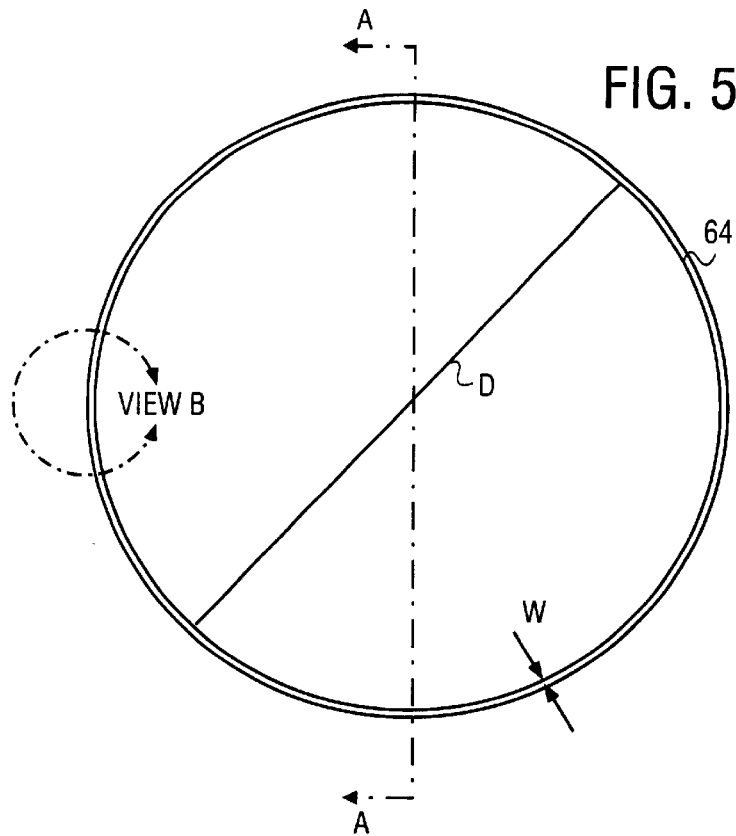
FIG. 5 is a top down view of the inert barrier of the present invention.
Figure 6:
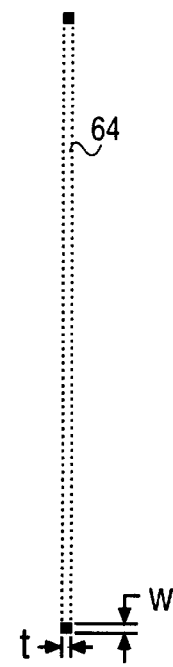
FIG. 6 is sectional view A—A of the inert barrier of FIG. 5.

FIG. 5 illustrates a top down view of a representative barrier 64 of the present invention as it would be installed in a reactor 15 at ambient conditions. When installed in reactor 15, barrier 64 circumscribes the processing region. Inner diameter D is about 20.3 inches for a representative processing reactor 15 capable of processing 300 mm substrates. FIG. 6 is view A—A of FIG. 5 and illustrates the rectangular cross sectional shape of representative barrier 64. Although a rectangular cross sectional shape is illustrated, one of ordinary skill in the art will appreciate that other cross sectional shapes, such as circular, elliptical, polygonal or other suitable shape may be employed without departing from the spirit of the present invention.

Figure 7:
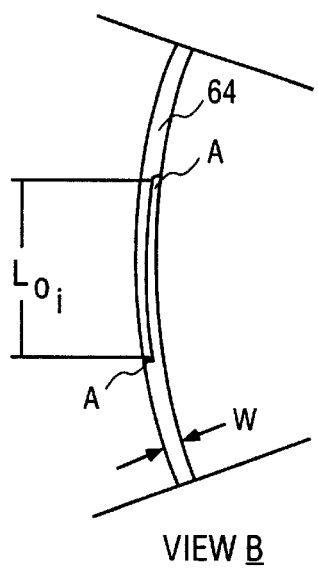
FIG. 7 is an enlarged initial view B of the inert barrier overlap region according to the present invention.

FIG. 7 illustrates an enlarged view B of FIG. 5. At ambient conditions or prior to any shrinkage of barrier 64, the initial length of overlap ($L_{oi}$) between adaptively coupled ends A and B coexist with the length of the notched portion of ends A and B. Put another way, in an ambient or pre-shrinkage condition, barrier 64 would separate processing region 18 from an adjacent O-ring by width w throughout the entire length of barrier 64 or the entire circumference of processing region 18. In a representative barrier 64, the length of initial overlap, $L_{oi}$, is about 3 inches which corresponds with the length of each of adaptively coupled ends A and B.

Figure 8:
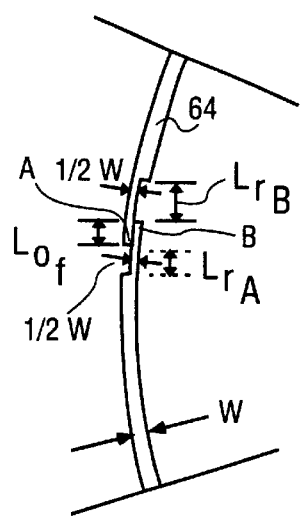
FIG. 8 is an enlarged final view B of the inert barrier overlap region according to the present invention.

FIG. 8 illustrates the enlarged view B of FIG. 5 after barrier 64 has been exposed to the deposition and cleaning operations conducted within processing region 18. As a result of shrinkage along the length of barrier 64, the overlap region illustrated in FIG. 8 has been diminished to $L_{of}$ or final length of overlap. The final length of overlap represents that portion of adaptively notched ends A and B which remain overlapped thereby providing a total width w between processing region 18 and an adjacent O-ring. $L_r$, or length of reduced width, is created as adaptively coupled ends A and B move from their initial positions shown in FIG. 7 to their representative final positions shown in FIG. 8. Thus, $L_{rA}$ represents the amount of length reduction associated with adaptively coupled end A. Similarly, $L_{rB}$ represents the amount of length reduction associated with adaptively coupled end B. That portion of barrier 64 associated with $L_{rA}$ and $L_{rB}$ represents that portion of barrier 64 in which only about one-half the original width of barrier 64 remains between processing region 18 and an adjacent O-ring. Thus, barrier material original width w must be sufficient such that a reduced thickness of about one-half w still provides suitable barrier material capabilities.

In a representative embodiment where chamber 15 is a 300 mm double dome CVD reactor and the initial unshrunk length (l) of a barrier 64 is about 64 inches, initial overlap ($L_{oi}$) is about 3 inches. After shrinkage has occurred in barrier material 64, the final length of overlap ($L_{of}$) is about 1.5 inches. Alternatively, the total length of reduced thickness ($L_r$) which represents the sum of each $L_r$ associated with adaptively coupled ends A and B is about 1.5 inches. Another desirable quality of a barrier material 64 is preferential shrinkage along the length and minimal to no shrinkage along the thickness and width of the material. Barrier 64 is installed such that the primary shrinkage axis is aligned circumferentially to processing region 18 such that all shrinkage along the length of barrier 64 is compensated for by adaptively coupled ends A and B as described above and illustrated in FIGS. 7 and 8.

Figure 9:
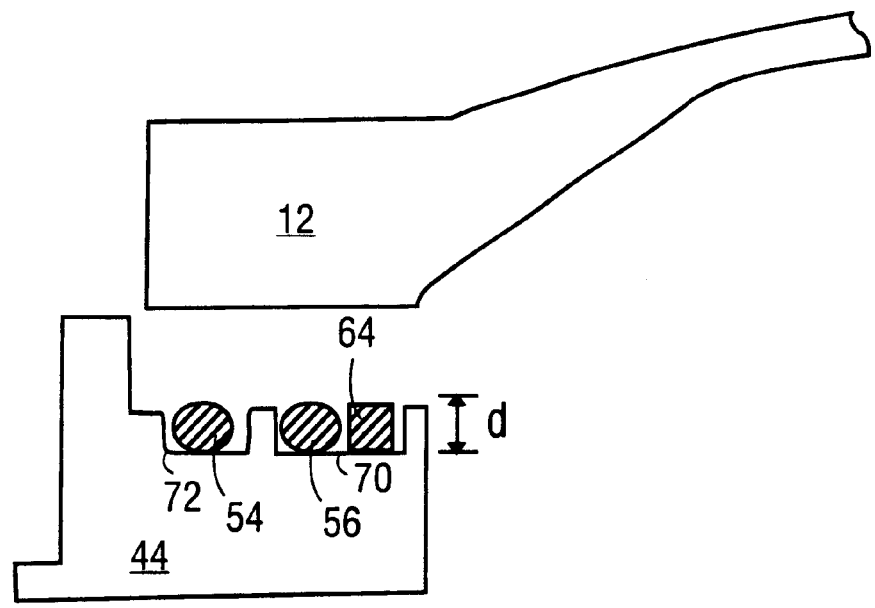
FIG. 9 is a cross section view of a sidewall in an unloaded position.
Figure 10:
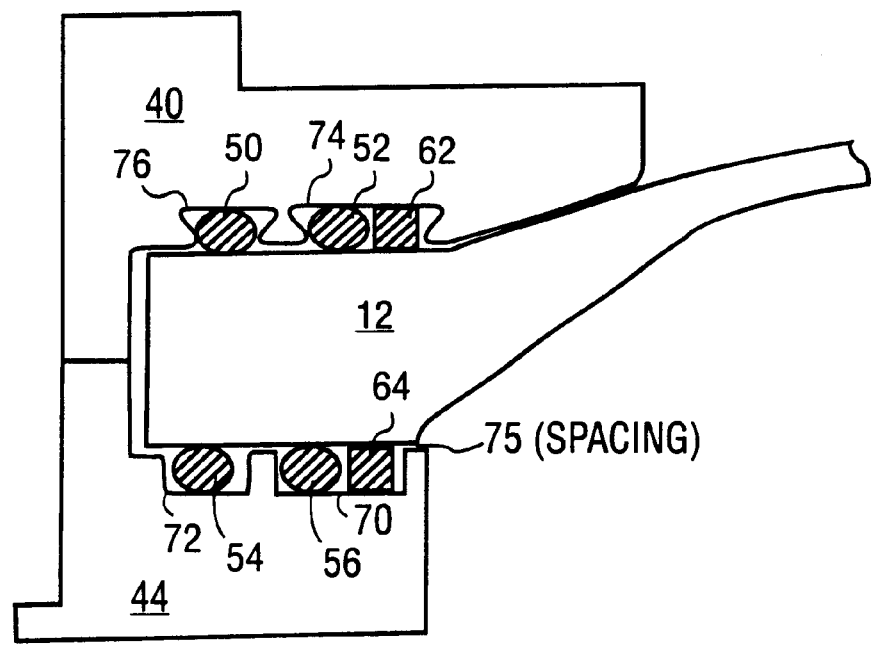
FIG. 10 is a cross section view of a sidewall in a loaded or installed position.

The installation and use of a representative barrier 64 is better appreciated by referring to FIGS. 9 and 10. FIG. 9 represents the placement of O-rings 54 and 56 and barrier 64 on base ring 44 prior to the placement of a quartz dome 12 and the installation of upper clamp ring 40. Although illustrated with base ring 44 and upper dome 12, similar procedures and dimensional requirements apply to O-rings 50, 52 and barrier 62 in upper clamp ring 40; O-rings 58 and barrier 66 in the lower surface of base ring 44; and O-ring 60 and barrier 68 in lower clamp ring 42. Barrier 64 is disposed adjacent to O-ring 56 in a groove 70 formed within stainless steel base ring 44. No adhesives are used to bond barrier 64 to either base ring 44 or O-ring 56. More importantly adhesives should not be used since any adhesive would defeat the degree of freedom employed by notched, slideably coupled ends of barrier 64. The slideably coupled ends A and B of barrier 64 are intended move freely along the circumference of processing region 18 within groove 70 to compensate for shrinkage of barrier 64 along its length and ensure adequate separation between the adjacent O-ring and processing region 18. Additional grooves are provided to accommodate other loading and sealing O-rings and barriers. For example, support and sealing O-ring 54 is disposed in groove 72 and O-ring 56 is disposed adjacent to barrier 64 in groove 70. Grooves 72 and 70 are formed in base ring 44.

Groove 70 has a depth (d) compatible with the size of reactor 15, the overall thickness of base ring 44, the cross-sectional diameter of O-rings 54, 56. Once the groove depth is determined, the original or unloaded thickness t of the barrier is selected to ensure sufficient contact between the top and bottom barrier surfaces and the members between which the barrier is positioned. The barrier material loading conditions provide sufficient compression to ensure the barrier separates the O-ring from the processing region. The original or unloaded thickness t also compensates for barrier shrinkage occurring in the t dimension. The thickness t is selected such that when shrinkage occurs in the t dimension, the barrier material still fills the allotted space between the members with sufficient contact to provide an effective barrier. As a result, to the degree that the barrier material shrinks in the t direction, the barrier remains intact and separates the adjacent O-ring from the processing region.

In a representative embodiment where reactor 15 is a CVD double dome reactor capable of processing 300 mm diameter workpieces and barrier 64 has an unloaded thickness (t) of 0.285 inches, groove 70 has a depth of about 0.215 inches. A suitable barrier material would have an initial, unloaded thickness on the order of 1.3 to 1.5 times the depth of the groove 70 to which it will be installed. Thus, the representative embodiment of FIG. 9 illustrates a groove depth of 0.215 inches and an initial barrier thickness of 0.285 which results in a barrier about 1.32 times as thick as the depth of its associated groove. Additional grooves are formed in top clamp 40, base ring 44 and bottom clamp 42 in order to similarly situate O-rings 50, 52, 54, 58 and 60 and barrier materials 62, 66 and 68.

In the loaded condition illustrated in FIG. 10, upper clamp ring 40 and base ring 44 provide compressive force to O-rings 50, 52, 54 and 56 in order to support top dome 12. In the loaded condition of FIG. 10, spacing 75 is maintained between stainless steel base ring 44 and top quartz dome 12. In the representative embodiment of FIG. 10, spacing 75 is on the order of 0.02 inches. A similar spacing exists between upper clamp ring 40 and top dome 12. Although not shown in FIG. 10, spacings exist between bottom dome 16 and both base ring 44 and lower clamp ring 42. As a result of compressive loading between clamp ring 40 and base ring 44, upper dome 12 is supported by O-rings 50, 52, 54 and 56. Although not used to enable a pressure seal for processing region 18, barriers 62 and 64 are also compressed from their original thickness. For example, the barrier 64 of FIG. 10 is about 0.235 inches thick from an original unloaded thickness of about 0.285 inches. This represents a slight compressive force. Although insufficient for sealing, this force is sufficient to ensure complete enough contact along the width of barrier 64 between top dome 12 and base ring 44 via groove 70 to ensure an effective barrier is formed between O-ring 56 and processing region 18.

Processing chambers employing the barrier layer of the present invention have demonstrated higher throughput and improved processing windows. For example, prior art systems which utilized O-rings only (i.e. chamber 10) were limited to three consecutive 20 $\mu$m deposition cycles followed by a single 1200° C. HCl clean lasting approximately 30 minutes. Additionally, the resistivity of epitaxial silicon produced in prior art reactors after conducting the above deposition and cleaning sequence is on the order of 20–30 $\Omega$-cm. Generally, intrinsic silicon resistively below 200 $\Omega$-cm is unacceptable for most commercial epitaxial silicon process requirements. Such a low resistivity in this case in indicative of O-ring degradation, and possible failure or other contamination within processing region 18.

Figure 11:
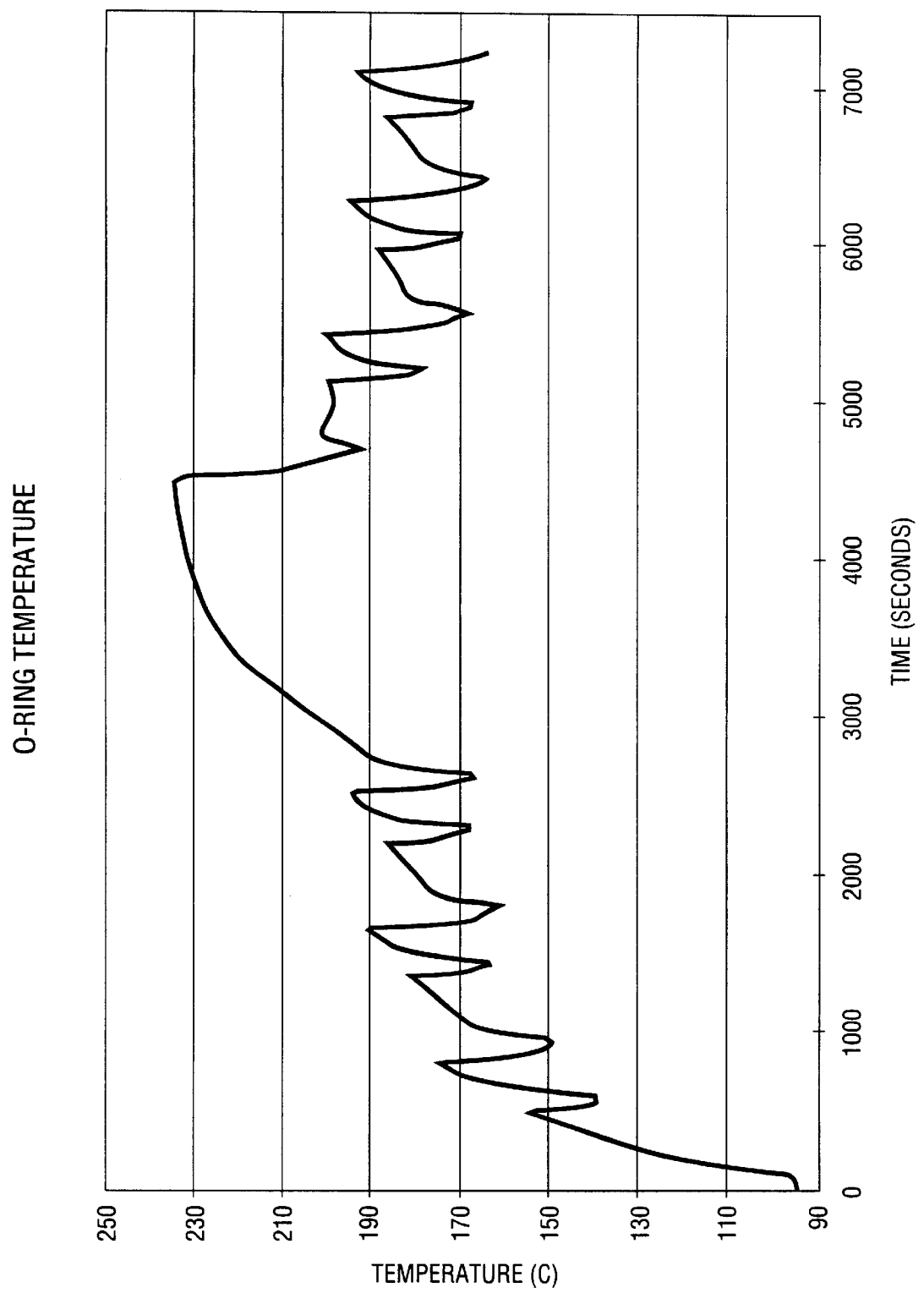
FIG. 11 is a graph illustrating O-ring temperature as a function of time for an O-ring installed in a chamber having a barrier layer according to the present invention.
Figure 12:
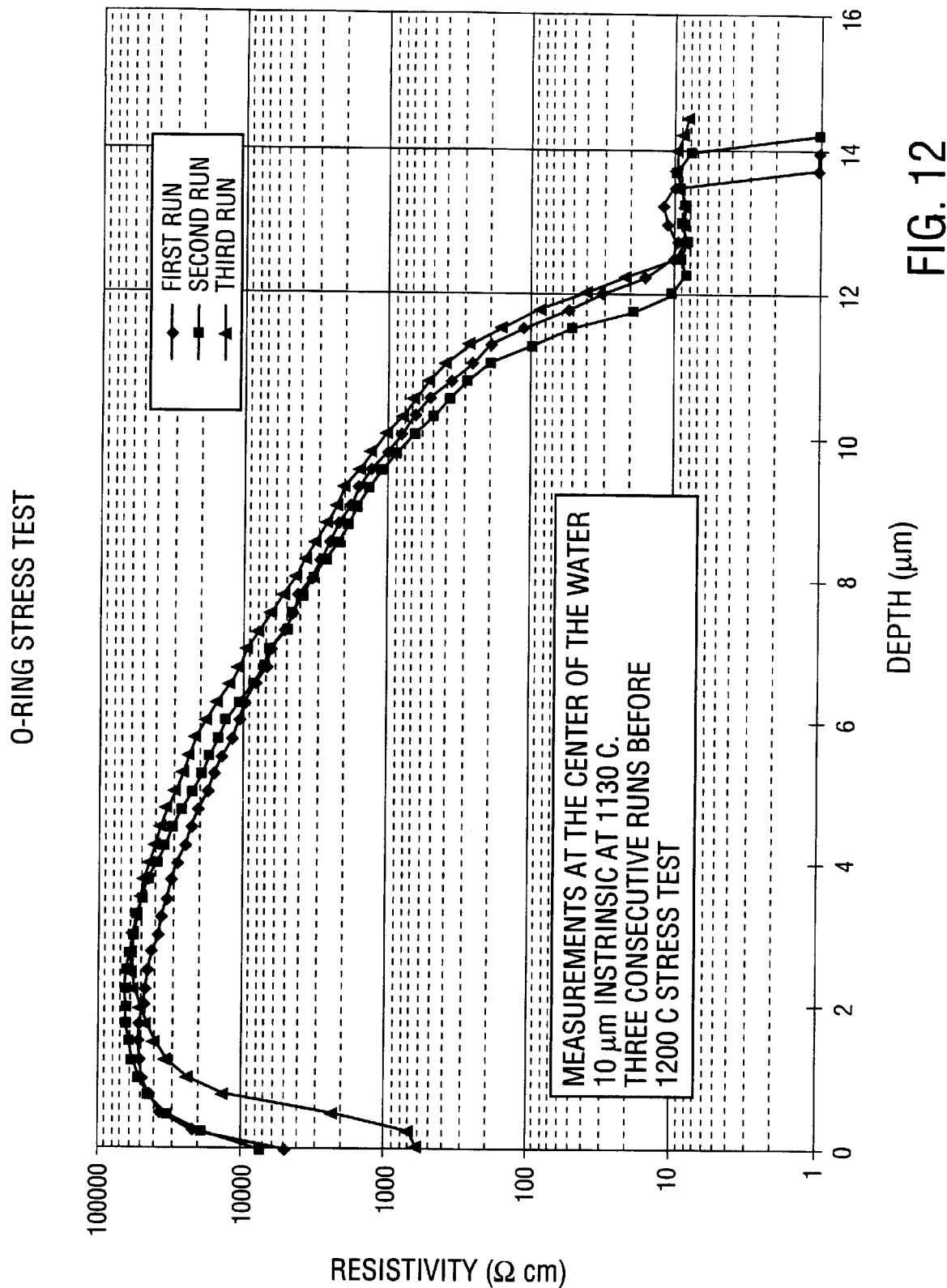
FIG. 12 is a graph of resistivity versus film thickness for a series of wafers processed in a reactor having an inert barrier according to the present invention.
Figure 13:
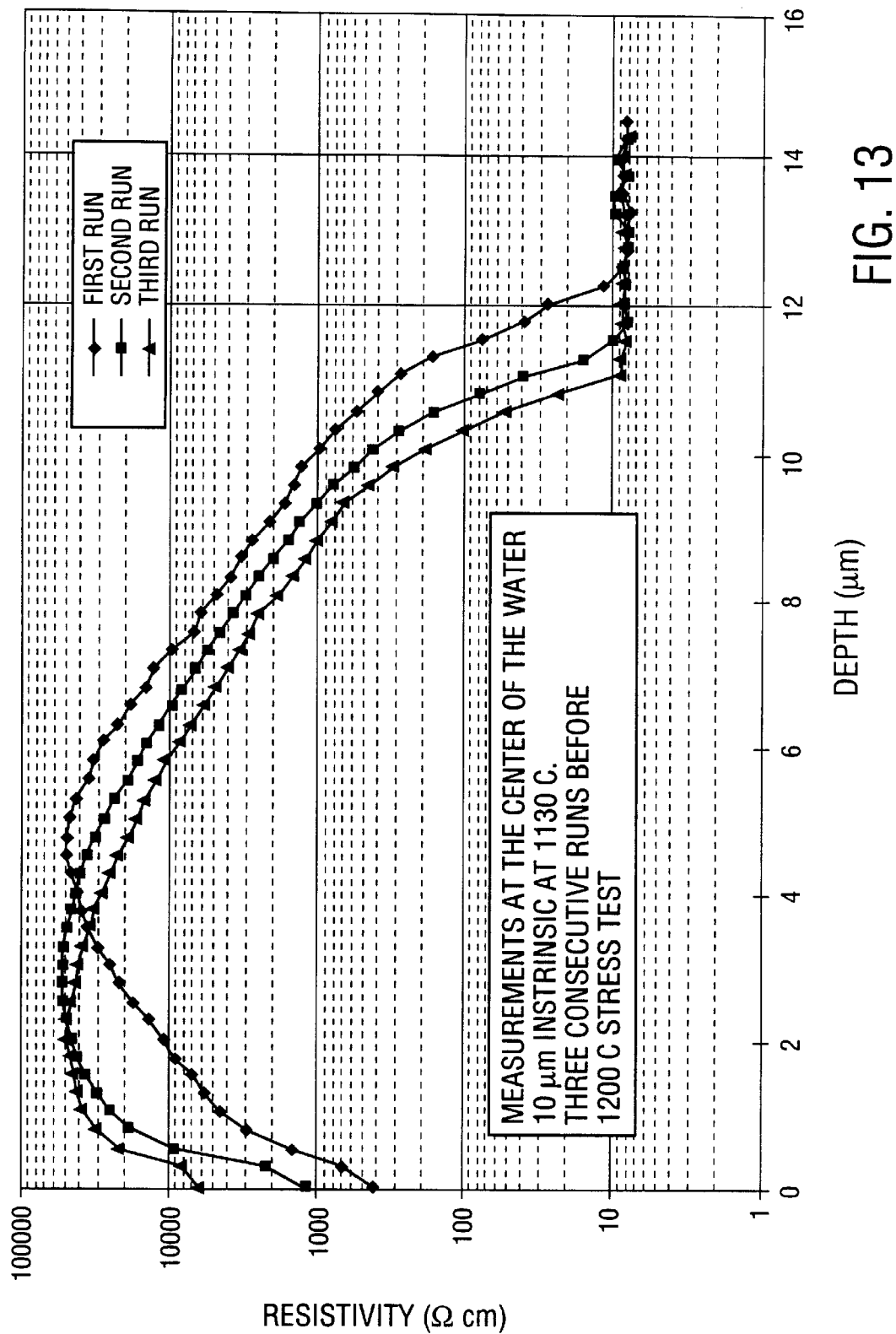
FIG. 13 is a graph of resistivity versus film thickness for a series of wafers processed in a reactor having an inert barrier according to the present invention.

Turning now to FIGS. 11, 12 and 13, the insulating and contaminate preventing properties of a processing reactor utilizing the barrier layer of the present invention can be better appreciated. FIG. 11 illustrates a stress test conducted in a reactor 15 to evaluate the improved insulating properties of the barrier material of the present invention. The graph represents a temperature reading taken at O-ring 56 located adjacent to barrier material 64 and separated from processing region 18. The test included six consecutive epitaxial silicon deposition processes up to approximately time 2600, followed by an extended 1200° C. HCl clean which lasted from about time 2600 to about 4600, or approximately 33 minutes. This extended HCl clean was immediately followed by an additional six epitaxial silicon deposition cycles. As indicated by the graph, an O-ring used in conjunction with a barrier material of the present invention was exposed to a maximum temperature of about 235° C. which occurred after the prolonged 1200° C. clean.

FIGS. 12 and 13 represent the resistivity of an intrinsic epitaxial silicon film deposited in a reactor 15 having the barrier of the present invention installed as described with respect to FIG. 3. In each of the tests illustrated by FIGS. 12 and 13, three wafers were processed consecutively in which each received at least 10 $\mu$m of epitaxial silicon deposition. The resistivity, or purity, measurement in $\Omega$-cm as a function of thickness of the film in $\mu$m is provided. The resistivity on the surface of the deposited epitaxial film is indicated at depth measurement 0 $\mu$m. Surface effects associated with resistivity measurement techniques can lead to lower than actual resistivity measurements at the surface of the measured film. In recognition of the impact of these surface effects, resistivity is commonly referred to as being "greater than" the measured surface resistivity.

FIG. 12 represents the resistivity measurements of three consecutive epitaxial silicon deposition sequences where at least 10 $\mu$m of epitaxial silicon was deposited on each substrate. The three substrates processed and measured in FIG. 12 were processed before conducting the stress test described above with respect to FIG. 11. The lowest resistivity or least pure epitaxial film was deposited during the third sequence where the resulting film had a resistivity of greater than 550 $\Omega$-cm. Considerably better quality silicon was deposited on the first and second deposition sequences where resistivities of greater than 5000 $\Omega$-cm and greater than 7500 $\Omega$-cm were measured.

FIG. 13 illustrates the resistivity measurements for three consecutive 10 $\mu$m deposition sequences performed after conducting the stress test illustrated in FIG. 11 and described above. As illustrated in FIG. 13, the lowest resistivity or, the least pure silicon, was greater than about 450 Ω-cm and was deposited during the first deposition sequence conducted after the stress test. The second and third films deposited obtained resistivities of greater than 1300 Ω-cm and greater than 6500 Ω-cm respectively.

As demonstrated by the results illustrated in FIGS. 11, 12 and 13, a processing reactor employing a barrier material according to the present invention can prolong primary O-ring seal life because of the insulating benefits provided the O-ring by the barrier material which helped maintain primary O-ring temperatures below 250° C. even during a most demanding 30 minute 1200° C. HCl cleaning cycle. Even if O-ring degradation occurred, the resistivities measured after the stress test indicate that the barrier material prevented contamination from reaching processing region 18 as the purity of the films deposited within processing region 18 remained high. Proof of the anti-contamination quality of the barrier of the present invention is provided by FIG. 13 and the high resistivity measurements obtained from the films deposited in a reactor having the barrier of the present invention after that reactor has conducted the stress test described above with respect to FIG. 11.

Generally, process film resistivity requirements (like those measured in FIGS. 12 and 13) are typically between about five to ten times the design resistivity requirements for a given application. Thus, a device or application requiring resistivity of about 10 to 20 Ω-cm would therefore require process film resistivity measurements between about 50 to 200 Ω-cm. Even after conducting the stress test, the reactor 15 having the barrier of the present invention deposited high purity epitaxial films with resistivity greater than 400 Ω-cm.

The above described processing reactor 15 having the barriers of the present invention can accommodate a number of different processes. The advantages of the present invention are better appreciated by illustration in the context of an epitaxial silicon deposition and clean sequence. Epitaxial silicon processing operations are particularly arduous as both the deposition and cleaning operations are conducted at temperatures above 1000° C. and are most likely conducted between about 1100–1200° C. In some cases, cleaning sequences employ process steps with temperatures as high as 1225° C. Thus, the deposition of epitaxial silicon poses special problems since the resulting deposition and cleaning cycles create sustained high temperature operation requirements for the epitaxial processing apparatus.

In a representative epitaxial silicon chemical vapor deposition cycle, a substrate 20 is placed on susceptor 22 within a double dome processing reactor 15 that includes inert barriers according to the present invention. After placing the substrate on susceptor 22, susceptor 22, substrate 20 and preheat ring 24 are heated by a plurality of high intensity lamps 26 to an appropriate deposition temperature. Representative epitaxial silicon deposition processes are conducted between about 950° C. to 1250° C. depending on source gas employed. For example, Silicon Tetrachloride, $SiCl_4$, has a deposition temperature between about 1150° C. to 1250° C. while Silane, $SiH_4$, has a deposition temperature of between about 950° C. and 1050° C. Drive 23 can be rotated to provide a time averaged environment for substrate 20 that is cylindrically symmetric. Deposition gases are introduced into processing region 18 from an external source via supply lines 30 and chamber inlet 32. A reactant gas mixture typically includes a source of silicon such as but not limited to silane, disilane, dichlorosilane, trichlorosilane and silicon tetrachloride. A non-reactive carrier gas such as hydrogen is injected into the processing chamber together with the reactant gas.

From the inlet 32, deposition gases flow across preheat ring 24, susceptor 22 and substrate 20 to exhaust port 36 and thereafter to an exhaust system. Although deposition is intended only on substrate 20, deposition occurs on other chamber surfaces that are sufficiently hot to cause the deposition reaction. For example, deposition occurs on such surfaces as preheat ring 24, the edge of susceptor 22 not covered by substrate 20, top and bottom domes 12 and 16 and, in some reactor designs, the backsides of susceptor 22 and preheat ring 24. During the deposition cycle, barrier 64 prevents the heated deposition reactants within processing region 18 that enter the gap between liner 118 and top dome 12 from reaching O-ring 56. Similarly, barrier 66 prevents heated deposition reactants within processing region 18 that enter the gap between liner 118 and bottom dome 16 from reaching O-ring 58. Barriers 62, 64, 66 and 68 also provide thermal insulation from the high temperatures that exist in processing region 18 during epitaxial silicon deposition.

Additionally, because the barriers 64 and 66 are advantageously located between the O-rings and processing region 18 particles or other contaminants generated by the O-rings are prevented from entering processing region 18 and contaminating the film deposited on substrate 20. Likewise, barrier 62 would prevent particles or contaminants generated by O-rings 50 and 52 from reaching and potentially coating or otherwise adversely impacting the transmission of radiant energy from lamps 26 in the top portion of reactor 15 into processing region 18. Similarly, barrier 68 would prevent particles or contaminants generated by O-ring 60 from reaching and potentially coating or otherwise adversely impacting the transmission of radiant energy from lamps 26 in the bottom portion of reactor 15 into processing region 18.

The deposition cycle is repeated for each substrate to be processed. In a typical epitaxial deposition sequence, a number of substrates will be processed and then a single clean sequence will be performed inside processing region 18 to remove deposits accumulated during the deposition cycle. Particularly contemplated is a commercially viable deposition and clean sequence wherein about 20 μm of epitaxial silicon deposition is followed by a single, prolonged, HCl based cleaning cycle lasting up to between about 5 to 10 minutes. After the last substrate of the deposition sequence has been processed and removed from the processing region, the temperature of processing region 18, measured at susceptor 22, is raised to about 1200° C. Next, HCl is introduced into processing region 18 via inlet 32. The gaseous HCl dissociates within processing region 18 and reacts with the silicon deposits and other accumulations to form volatile by-products. These volatile by-products are subsequently exhausted from processing region 18 via exhaust port 36.

As with the deposition process, barriers 64 and 66 protect sealing O-rings 56 and 58 from degradation as a result of direct contact with the high temperature gases employed during the cleaning process. Particularly with regard to the cleaning process, barriers 64 and 66 prevent chemical attack that would result from contact between O-rings 56 and 58 and the reactive cleaning agents employed within processing region 18 during the cleaning cycle. In the 1200° C. HCl clean typical to epitaxial reactors, one highly reactive cleaning agent employed is chlorine.

During the cleaning cycle, barrier 64 prevents the heated cleaning gases within processing region 18 that enter the gap between liner 118 and top dome 12 from reaching O-ring 56.

Similarly, barrier 66 prevents heated cleaning gases within processing region 18 that enter the gap between liner 118 and bottom dome 16 from reaching O-ring 58. Barriers 62, 64, 66 and 68 also provide thermal insulation from the high HCl clean temperatures employed in processing region 18.

Additionally, because the barriers 64 and 66 are advantageously located between the O-rings and processing region 18 particles or other contaminants generated by the O-rings are prevented from entering processing region 18 and interfering with the cleaning process. If O-rings 50 and 52 become degraded and produce particles or contaminants then barrier 62 would prevent those particles or contaminants from reaching and potentially coating or otherwise adversely impacting the transmission of radiant energy from lamps 26 in the top portion of reactor 15 into processing region 18. If O-ring 60 becomes degraded and produces particles or contaminants, then barrier 68 would prevent those particles or contaminants from reaching and potentially coating or otherwise adversely impacting the transmission of radiant energy from lamps 26 in the bottom portion of reactor 15 into processing region 18.

Although described with regard to epitaxial silicon deposition, other processing operations could advantageously utilize the barrier layer of the present invention. For example, amorphous silicon, doped silicon and polysilicon deposition processes employ a 1200° C. HCl clean cycle similar to the one described above. These types of deposition reactors could employ the barrier of the present invention to likewise achieve the ability to conduct prolonged 1200° C. HCl clean cycles without O-ring degradation. Just as the barrier of the present invention prevents chloride chemical attack, the barrier could be employed with other clean chemistries to likewise prevent other types of chemical attack as well. For example, the barrier of the present invention could be employed to prevent fluorine chemical attack in those processing chambers that employ fluorine based clean chemistries such as the use of $NF_3$.

While specific embodiments of the invention have been shown and described, further modifications and improvements will occur to those skilled in the art. It is desired that it be understood, therefore, that the invention is not limited to the particular form shown and it is intended in the appended claims which follow to cover all modifications which do not depart from the spirit and scope of the invention.

We claim:

1. A semiconductor substrate processing apparatus comprising:
    (a) a processing chamber having a first member, a second member and a processing region;
    (b) a vacuum tight seal between said first and said second members that enables a pressure controlled environment within said processing region; and
    (c) a barrier disposed between said first and second members which separates said seal from said processing region, said barrier being substantially non-reactive with processes conducted in said processing region and wherein said barrier has slideably coupled ends.

2. An apparatus according to claim 1 wherein barrier is said substantially non-reactive to epitaxial silicon deposition processes conducted within said processing region.

3. An apparatus according to claim 1 wherein said barrier is said substantially non-reactive to processes which include temperatures of about 1200° C. within said processing region.

4. An apparatus according to claim 1 wherein said barrier is said substantially non-reactive to processes which include HCl at temperatures of about 1200° C. within said processing region.

5. An apparatus according to claim 1 wherein said inert barrier comprises expanded polytetrafluoroethylene.

6. An apparatus according to claim 1 wherein said barrier is sufficiently thick such that when shrinkage occurs in the thickness of the barrier the barrier still fills the allotted space between said first and second members.

7. An apparatus according to claim 1 wherein said barrier is continuous and circumscribes said processing region.

8. An apparatus according to claim 7 wherein said barrier has slideably coupled ends, a first length at a first temperature, a second length at a second temperature, wherein said first temperature is lower than said second temperature and said second length is shorter than said first length wherein said slideably coupled ends allow said barrier to contract from said first length to said second length while said barrier continuously separates said seal from said processing region.

9. An apparatus according to claim 8 after said barrier has contracted from said first length to said second length said seal remains separated from said processing region by about half the thickness of said barrier.

10. An apparatus for depositing silicon comprising:
    (a) a processing chamber having a first element, a second element and a processing region;
    (b) an O-ring between said first and second elements that enables pressure controlled processes within said processing region; and;
    (c) a linearly shaped material comprising expanded polytetrafluoroethylene said material being substantially inert to the temperature, pressure and chemical environment within said processing region, said material having a first notched end, a second notched end adaptively coupled to said first notched end, a thickness and a length wherein said linear material circumscribes said processing region when said first notched end is coupled to said second notched end thereby said inert material separates said processing region from said O-ring.

11. An apparatus according to claim 10 wherein said first notched end is aligned with said second notched end such that said processing region is separated from said O-ring by about one-half the thickness of said inert material.

12. An apparatus according to claim 10 wherein the length of the material is sufficiently long such that said first and said second notched ends will overlap regardless of temperature within said processing region and shrinkage of the material.

13. An improved silicon deposition apparatus comprising:
    (a) a processing chamber having a first element, a second element and a processing region suitable for deposition of intrinsic silicon;
    (b) a pressure seal formed between said first and second elements providing a pressure controlled environment within said processing region; and
    (c) a barrier layer having adaptively coupled ends formed between said first and second elements which separates said pressure seal from said processing region wherein said barrier layer prevents contaminants from said seal from reaching said processing region and said barrier provides insulation for said seal from heat and chemicals used within said processing region and said barrier is substantially inert to the heat and chemicals used within said processing region.

14. A semiconductor substrate processing apparatus comprising:
    (a) a processing chamber having a top dome, a bottom dome, a base ring and a clamp ring coupled to and separating said top dome and said bottom dome wherein said top dome, bottom dome, base ring and clamp ring define a processing region, a susceptor disposed within said processing region, a plurality of lamps which illuminate said susceptor, and a quartz liner disposed adjacent to said susceptor;

(b) a seal disposed between said base ring and each of said domes and a seal between said clamp ring and each of said domes wherein said domes, said base ring and said clamp rings are compressably in contact with said seals to enable a pressure controlled environment within said processing region; and (c) barriers disposed between each of said seals and said processing region wherein said barriers have slideably coupled ends and prevent contaminants from said seals from reaching said processing region.

wherein said seals and said barriers are disposed within grooves formed in said clamp ring and said base ring.

15. An apparatus according to claim 14 wherein said base ring and said clamp ring are formed from stainless steel.

16. An apparatus according to claim 14 wherein said seals have circular cross sections and said barriers have rectangular cross sections.

17. An apparatus according to claim 14 wherein the thickness of said barriers is less than twice the depth of said grooves.

* * * * *